(12) United States Patent
Fukaya et al.

(10) Patent No.: US 8,487,251 B2
(45) Date of Patent: Jul. 16, 2013

(54) METHOD FOR CONTROLLING CHARGING OF SAMPLE AND SCANNING ELECTRON MICROSCOPE

(75) Inventors: Ritsuo Fukaya, Hitachinaka (JP); Nobuhiro Okai, Kokubunji (JP); Koki Miyahara, Hitachinaka (JP); Zhigang Wang, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 329 days.

(21) Appl. No.: 13/059,537

(22) PCT Filed: Aug. 8, 2009

(86) PCT No.: PCT/JP2009/065454
§ 371 (c)(1),
(2), (4) Date: Feb. 17, 2011

(87) PCT Pub. No.: WO2010/035621
PCT Pub. Date: Apr. 1, 2010

(65) Prior Publication Data
US 2011/0139981 A1  Jun. 16, 2011

(30) Foreign Application Priority Data

Sep. 24, 2008 (JP) ................................ 2008-243528

(51) Int. Cl.
*G01N 23/00* (2006.01)
(52) U.S. Cl.
USPC ............ 250/307; 250/306; 250/310; 250/311

(58) Field of Classification Search
USPC ............ 250/306, 307, 310, 311, 492.1–492.3
See application file for complete search history.

(56) References Cited

U.S. PATENT DOCUMENTS

2007/0057183 A1   3/2007 Arai et al.
2009/0065694 A1*  3/2009 Arai et al. ..................... 250/310

FOREIGN PATENT DOCUMENTS

| JP | 2006-054094 A | 2/2006 |
| JP | 2006-114426 A | 4/2006 |
| JP | 2006-302548 A | 11/2006 |

* cited by examiner

*Primary Examiner* — Michael Maskell
(74) *Attorney, Agent, or Firm* — Miles & Stockbridge P.C.

(57) ABSTRACT

An object of the present invention is to provide a scanning electron microscope aiming at making it possible to control the quantity of electrons generated by collision of electrons emitted from a sample with other members, and a sample charging control method using the control of electron quantity. To achieve the object, a scanning electron microscope including a plurality of apertures through which an electron beam can pass and a mechanism for switching the apertures for the electron beam, and a method for controlling sample charging by switching the apertures are proposed. The plurality of apertures are at least two apertures. Portions respectively having different secondary electron emission efficiencies are provided on peripheral portions of the at least two apertures on a side opposed to the sample. The quantity of electrons generated by collision of electrons emitted from the sample can be controlled by switching the apertures.

7 Claims, 3 Drawing Sheets

(TOP VIEW OF MOVABLE OPPOSED PLATE 112)

(TOP VIEW OF MOVABLE OPPOSED PLATE 112)

$$Q = \int_0^{T_0} (i_{\text{PRIMARY ELECTRONS}} - i_{\text{SECONDARY ELECTRONS + REFLECTED ELECTRONS}} + i_{\text{RE-INCIDENT ELECTRONS}}) dt$$

METHOD FOR CONTROLLING CHARGING OF SAMPLE AND SCANNING ELECTRON MICROSCOPE

TECHNICAL FIELD

The present invention relates to a method for controlling sample charging and a scanning electron microscope. In particular, the present invention relates to a sample charging control method, and a scanning electron microscope, utilizing electrons emitted from a sample once. The present invention relates to a scanning electron microscope for observing a nonconductive sample, among scanning electron microscopes. In particular, the present invention is applied to a scanning electron microscope for observing a pattern of a photomask which functions as a transfer matrix of a circuit pattern of a wafer substrate which forms a semiconductor device or a device, in a manufacturing process of the semiconductor device.

BACKGROUND ART

In the semiconductor device manufacture industry, a dedicated scanning electron microscope called critical dimension—scanning electron microscope (CD-SEM) is widely used to measure dimensions of fine circuit patterns formed on a sample. Furthermore, in forming a circuit pattern on a wafer, a technique of transferring a pattern of an opaque film formed on a transparent substrate called photomask by using short wavelength laser light having a wavelength of approximately 200 nm forms a mainstream. Measurement of dimensions of a pattern on a photomask is also an important quality control process.

If the balance between an electron beam incident on a sample and secondary electrons emitted from the sample by irradiation with the electron beam is zero, the sample is not charged. However, a secondary electron emission efficiency $\delta$ (=emitted electron quantity/incident electron quantity) which indicates a ratio of incident electrons to emitted electrons changes according to landing energy at the time when the electron beam is incident on the sample. If landing energy which makes the secondary electron emission efficiency equal to unity us selected according to the kind of the sample, therefore, sample charging is not caused theoretically. As a matter of fact, however, the landing energy is sometimes determined according to the measurement or inspection conditions or the like. In some cases, therefore, condition setting with only the balance of electrons taken into consideration cannot be conducted. In Patent Document 1, a technique of repelling secondary electrons by a potential barrier generated by irradiation with the electron beam and thereby relaxing the positive charging generated in the sample is described. Especially in the Patent Document 1, it is described to control a voltage applied to an electrode which is disposed to be opposed to a sample in order to stabilize the charging.

CITATION LIST

Patent Literature

Patent Literature 1: JP-A-2006-054094 (Corresponding U.S. Patent US2007/0057183)

SUMMARY OF INVENTION

Technical Problem

According to the technique disclosed in Patent Literature, it becomes possible to suppress charging quickly by rationalizing the potential barrier. However, any mention is not made at all as to existence of electrons generated by collision of electrons emitted from the sample with a structure of the SEM. For example, an object lens and an electrode disposed between the object lens and the sample are installed in the SEM so as to be opposed to a sample which is irradiation object of the electron beam. If electrons emitted from the sample collide with such a structure, electrons are generated.

Upon arrival of such electrons at the sample, the situation of charging changes. In other words, if the quantity of such electrons can be controlled rationally, it becomes possible to rationalize the balance between electrons incident on the sample and electrons emitted from the sample more easily. Hereafter, a scanning electron microscope making it possible to control the quantity of electrons generated by collision of electrons emitted from the sample with other members for its object, and a sample charging control method using the control of electron quantity will be described.

Solution to Problem

In order to achieve the object, a scanning electron microscope including a plurality of apertures through which an electron beam can pass and a mechanism for switching the plurality of apertures for the electron beam, and a method for controlling sample charging by switching the apertures are proposed. The plurality of apertures are at least two apertures. Portions respectively having different secondary electron emission efficiencies are provided on peripheral portions of the at least two apertures on a side opposed to the sample. Owing to switching of the apertures, it becomes possible to control the quantity of electrons generated by collision of electrons emitted from the sample. As a result, it becomes possible to control the quantity of electrons incident on the sample and the quantity of electrons emitted from the sample.

Advantageous Effects of Invention

According to the proposal, it becomes possible to control the ratio of the quantity of electrons incident on the sample to the quantity of electrons emitted from the sample. As a result, charging on the surface of the sample can be controlled.

DESCRIPTION OF EMBODIMENTS

Hereafter, a technique of controlling the balance between electrons incident on the sample and emitted electrons will be described by taking a CD-SEM which is an example of the scanning electron microscope as an example. In the ensuing description, an example in which charging of a photomask which is one of objects of measurement using a CD-SEM is controlled will be described. However, the technique is not restricted to the example, but the technique can also be applied to charging control of other measurement and inspection objects such as a semiconductor wafer.

Figure 2:
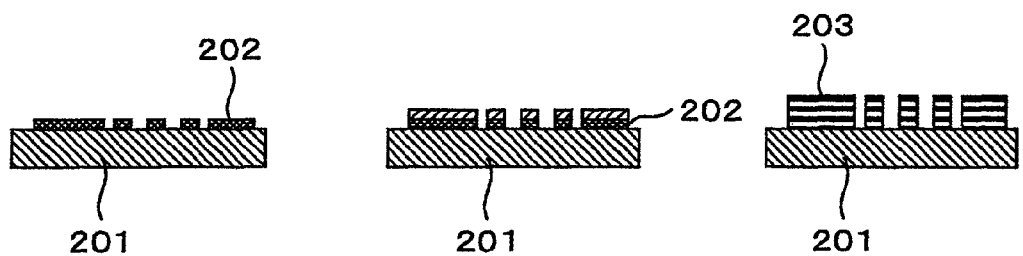
FIG. 2 is a diagram for explaining a structure of a photomask.

As shown in FIG. 2, the photomask is obtained by forming a circuit pattern using a material which is low in ultraviolet ray transmittance such as chromium 202 or molybdenum silicon oxide (MoSiO) 203 on a substrate 201 made of a material which is high in ultraviolet ray region transmittance such as synthetic silica glass. Furthermore, in the course of the mask production, a photoresist 204 exists on the pattern sometimes. The most serious fault in observing such a photomask with a scanning electron microscope is a charging phenomenon of the surface.

As for the substrate of the photomask, silica glass forms the mainstream as described above, and it is a dielectric. In the electron microscope, therefore, the surface is charged by action of an irradiation electron beam (primary electron rays). Polarization is conducted easily and potential is generated by applying an electric field from the external. A local electric field formed by generated electric charges sometimes exerts influence upon a trajectory of primary electron rays and exerts bad influence such as strain of an observed image, movement of an image, or a magnification change.

Observation of a dielectric using an electron microscope is a long-standing technical problem. If destructive observation is possible, it has been conducted to form a thin film of a conductive substance on the surface. If a nondestructive inspection such as a device inspection process is demanded, however, it is coped with by lowering incident (landing) energy (acceleration voltage) of an electron beam and reducing the electron beam. If most of the sample volume is formed of a dielectric as in the photomask, however, it is difficult to sufficiently suppress the bad influence described above.

Furthermore, a technique of causing inactive gas molecules to exist in a space near the surface of a sample to be observed with a suitable partial pressure and actively removing electric charges on the surface of the substrate by using molecules which are subjected to weak electrolytic dissociation by action of an electron beam has also been put to practical use. In this case, however, inactive molecules scatter secondary electrons and consequently there is a problem that the image signal is degraded. Therefore, the technique does not get to be spread in the semiconductor manufacturing industry. In addition, a technique of irradiating the sample with charged particles generated separately is also proposed. However, it is difficult to determine the neutral point of sample charging suitably.

Figure 3:
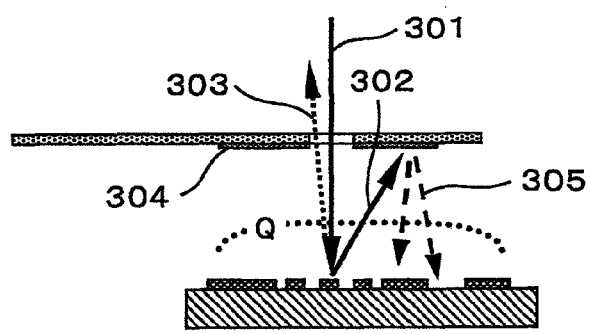
FIG. 3 is a diagram for explaining a phenomenon which occurs when a sample is irradiated with an electron beam.

In the present embodiment, the mechanism of charging of the sample surface has been studied again. A phenomenon which occurs when the sample is irradiated with an electron beam is shown in FIG. 3. An electron beam 301 incident on the sample surface is reflected to the incidence direction by the so-called Rutherford scattering (302) during the course in which the electron beam 301 scatters the inside of the sample constituent substance, or the electron beam 301 kicks out electrons in the shell from atoms and generates secondary electrons 303. The generation efficiency of secondary electrons (which represents the average number of secondary electrons generated from one primary electron (which is represented sometimes as secondary electron emission efficiency as well)) depends upon the composition of substances, and the generation efficiency of secondary electrons is a function of kinetic energy of primary electrons. In general, in an energy region used in the scanning electron microscope of low acceleration type, the generation efficiency exceeds 1.0 and consequently the sample is positively charged gradually.

Sometimes, however, a part of primary electrons reflected backward is incident on a nearby object such as an opposed plate 304 and generates secondary electrons 305 again. The secondary electrons are re-incident on the sample with energy of several electron volts, and contribute to the sample charging. In other words, electric charges stored in the sample during unit time are represented by the following Equation (1). (For convenience, the polarity of a current formed by electron rays is represented as positive.)

[Math. 1]

$$Q = \int_0^{T_0} (i_{\text{primary electrons}} - i_{\text{secondary electrons+reflected electrons}} + i_{\text{re-incident electrons}}) dt \quad (1)$$

Q: Stored electric charges $T_0$: Irradiation time with primary electron rays i primary electrons: Inflow current formed by primary electron rays i secondary electrons+reflected electrons: Outflow current formed by secondary electrons and reflected electrons i re-incident electrons: Inflow current formed by re-incidence of secondary electrons which are generated by reflected electrons It is now considered to make Q small as far as possible. The term "i primary electrons" is set together with incident energy of the primary electron rays by rationalization of the image observation condition. The term "i secondary electrons+reflected electrons" is a function of the sample constituent substances and the incidence energy of the primary electron rays, and it cannot be set arbitrarily. On the other hand, "i re-incident electrons" depends upon the shape and constituent substances of a member with which the reflected electrons collide, and consequently it can be controlled to some degree. Therefore, Q can be reduced by rationalizing constituent materials of the reflection plate. Since "i secondary electrons+reflected electrons" depends upon the constituent substances of the sample, it is appreciated that optimum constituent materials of the reflection plate differ depending upon the constituent substances of the sample.

In the present embodiment, therefore, it is made possible to previously select optimum selected materials according to the configuration of the sample, provide a plurality of regions formed of the materials on an opposed face, and selectively cause a region having the most suitable secondary electron emission efficiency among the regions to be opposed according to the kind of the sample.

If the constituent materials of the sample are standardized in the industry and restricted to a small number of specific materials as in the photomask observation, the present embodiment is extremely effective. As a matter of fact, "i secondary electrons+reflected electrons" and "i re-incident electrons" depend upon the local potential of the sample as well. Since the local potential depends upon Q, each of them is also a function of time. However, it does not influence the essence of the present embodiment. For controlling arrival of the secondary electrons or reflected electrons at the opposed face, a method of providing a control grid having a suitable potential between the opposed electrode and the sample is also conceivable. In this case, however, there are the following disadvantages: 1) polarized charges are induced in a dielectric which forms the sample by a potential difference between a control electrode and the sample; and 2) the trajectory of the primary electron rays is bent by an electric field generated by the control electrode and electro-optical parameters such as the magnification are influenced, resulting in complicated control. Therefore, the method is inferior to the present embodiment in superiority.

Especially if the dielectric material is observed with a scanning electron microscope, degradation of the observed image is caused by influence of the sample charging sometimes as described in detail heretofore.

Hereafter, a sample charging control method and a scanning electron microscope in which a plurality of regions each having an optimum secondary electron reflection efficiency every sample constituent substance are provided on a face opposed to the sample and the region is switched according to the sample in order to reduce the quantity of charges stored in the dielectric sample will be described.

There is an advantage that the charging quantity of the sample can be reduced without influencing other electro-optical parameters by controlling the charging speed every constituent material of the sample. The method is extremely effective especially in the case where the observation object is restricted to samples of several kinds constituent materials of which are previously known.

Figure 1:
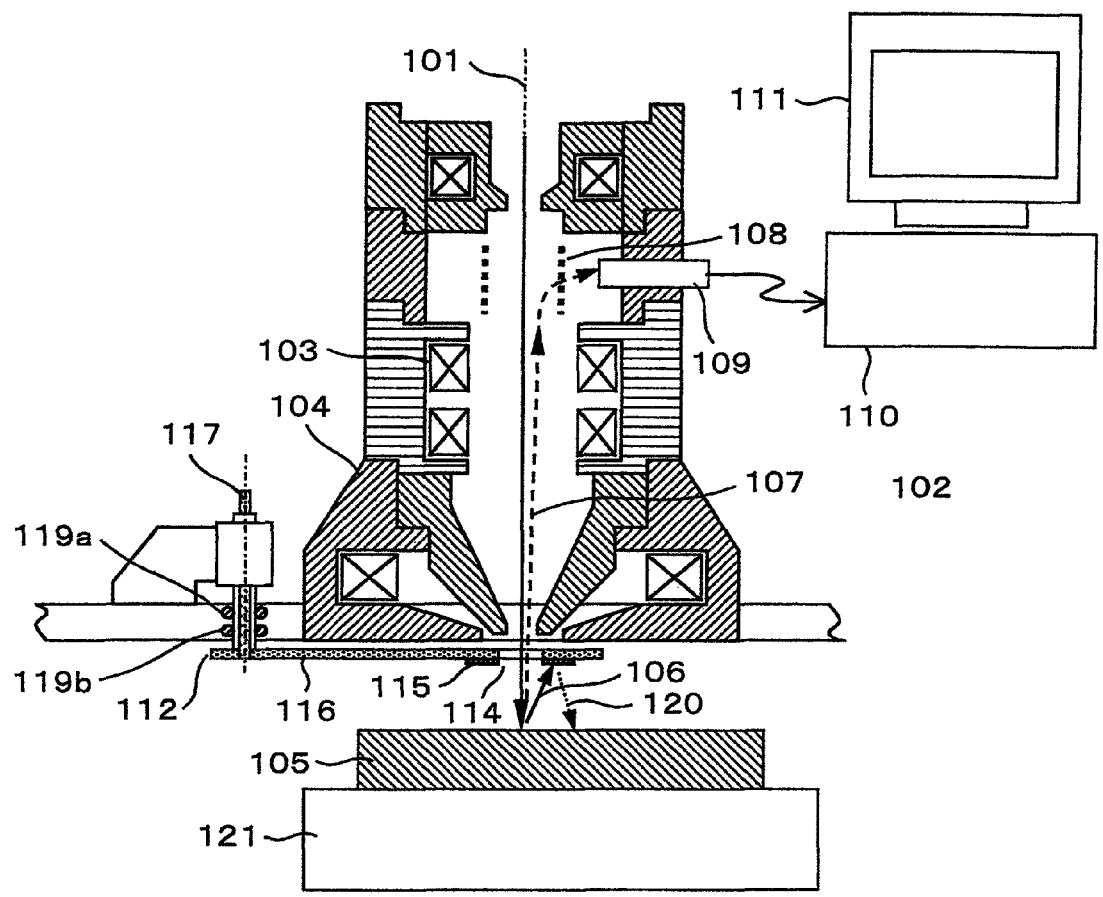
FIG. 1 is a sectional view of an electro-optical system in a scanning electron microscope.
Figure 1:
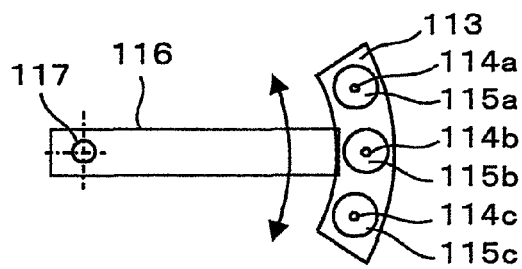

FIG. 1 is a sectional view of an electro-optical system in the scanning electron microscope. Primary electron rays 101 (electron beam) emitted from an electron gun (omitted in FIG. 1) located above are converged by a condenser lens 102 and deflected by a deflection coil 103, then finally converged to electron rays having a diameter of several nm (nanometers) by an object lens 104, and incident onto the surface of a sample 105 which is an observation object.

A part of incident primary electrons is reflected backward, resulting in reflected electrons 106. Furthermore, another part generates secondary electrons 107 while scattering the inside of the sample. The secondary electrons are pulled up upward by a static electric field applied between the sample 105 and the object lens 104, and taken into a detector 109 by a separation mechanism 108. A photomultiplier tube is incorporated in the detector 109, and the photomultiplier tube generates a voltage depending upon the quantity of the secondary electrons. The voltage is processed in a signal processing apparatus 110, and then displayed as an image by an image display part 111. The sample 105 is placed on a precision stage 121, and an observation place can be positioned right under an axis of the electro-optical system in order to observe a desired place on the sample. Furthermore, a negative voltage application terminal (not illustrated) is installed on the precision stage 121 to apply a negative voltage to the sample. Arrival energy of the electron beam at the sample is controlled by a negative voltage (hereafter referred to as retarding voltage as well) applied to the sample, and measurement and inspection are conducted by using proper arrival energy.

A movable opposed plate 112 (moving mechanism) which is a feature of the present embodiment is present between the sample 105 and the object lens 104. In the present embodiment, the movable opposed plate 112 includes a fan-shaped nonmagnetic metal plate (such as phosphor bronze) 113. In the present embodiment, three through holes 114a, 114b and 114c are bored through the nonmagnetic metal plate 113. There are circular regions 115a, 115b and 115c each having a radius of approximately 8 mm around the three through holes, respectively. Thin films of substances which are different in secondary electron emission efficiency are formed in the circular regions to have a thickness of approximately 5 μm.

The films are formed by using the sputter or evaporation technique. The film material differs depending upon the observation object. In the present embodiment, however, a nonmagnetic and conductive substance which is somewhat low in secondary electron emission efficiency as compared with ordinary metal in the range of incidence electron energy of 0.5 to 1.5 k electron volts, such as titanium carbide or amorphous silicon, is selected supposing the case where a photomask for semiconductor is observed. The metal plate 113 is coupled to a beam 116. A second end of the beam 116 is coupled to a rotation shaft 117. The rotation shaft 117 can be rotated accurately by using a pulse motor 118. O-rings 119a and 119b are provided in a through portion of the shaft to maintain the vacuum. One of the through holes 114a to 114c can be positioned accurately right under the axis of the object lens 104 by sending a predetermined pulse signal to the pulse motor. For example, when the through hole 114a is positioned right under the axis, the region 115a receives the reflected electrons 106 from the sample and emits secondary electrons 120. A part of the secondary electrons 120 is re-incident on the sample.

The quantity of charges stored in the sample depends upon the sum total of the primary electrons 101, the reflected electrons 106, the secondary electrons 107, and the secondary electrons 120. When observing a mask using, for example, MoSiO as a pattern material, it is possible to reduce the potential change of the sample and suppress the magnification variation, the image movement and the like by using titanium carbide TiC as a film material in the region.

As described heretofore, it becomes possible to suppress the sample charging and relax various phenomena caused by the charging by selecting a through hole which makes the balance between electrons incident on the sample and electrons emitted from the sample equal to nearly zero from among the through holes in which film materials having different secondary electron emission efficiencies are provided.

The balance between the electrons depends upon the quality of the material of the sample, the arrival energy of the electron beam, and the like. In addition, however, it is possible in the present embodiment to cause the quantity of secondary electrons generated by collision of the reflected electrons, secondary electrons and the like with a member opposed to the sample to become the control object. As a result, it becomes possible to improve the degree of freedom in setting the optical conditions (such as the arrival energy) of the electron beam.

Furthermore, if the kind (the quality of the material) of the sample and the optical conditions (such as the arrival energy of the electron beam) are previously known, it is also possible to store a through hole which causes Q to become closest to zero in association with the kind of the sample and the optical conditions and control the movable opposed plate 112 to automatically select the through hole as the passage port of the electron beam when the kind of the sample and the optical conditions are selected. In addition, it is possible to make the kind of the through hole settable as one of setting items in a recipe for setting the measurement conditions of the scanning electron microscope.

The control described heretofore may be exercised in, for example, the signal processing apparatus 110 (control apparatus) or may be exercised from an external control apparatus. A storage medium is incorporated in the control apparatus to store relations among the kind of the sample, the optical conditions, and the kind of the through hole. Furthermore, a program for exercising the above-described control is stored in the storage medium.

Figure 4:
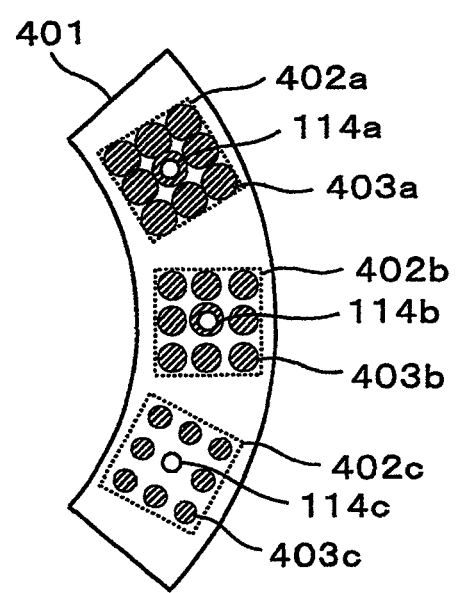
FIG. 4 is a diagram for explaining another example of a movable opposite plate.

FIG. 4 shows another configuration of the movable opposed plate 401. For changing the secondary electron emission efficiency of the opposed plate, the area of a film of the same substance formed in areas 402a, 402b and 402c may be made different instead of forming thin films of different substances respectively in those areas. In FIG. 4, circular dots 403a, 403b and 403c which are formed of the same substance (for example, carbon) and which are different in diameter are formed in the three areas 402a, 402b and 402c, respectively. In portions outside dots, the secondary electron emission efficiency becomes that of an underlying material 404 (phosphor bronze). In the dots, the secondary electron emission efficiency becomes that of carbon. An average emission efficiency in a region depends upon the area ratio between the underlying material and the dot. Such formation of a film on a dot can be conducted easily by using the photolithography technique after the sputtering or evaporation or using a protection plate through which a window having a desired shape is opened, at the time of fabricating a film. By the way, in the present embodiment, the position of the movable opposed plate is changed by using a rotation mechanism using the pulse motor. However, this has no relation to the essence of the present embodiment. It is a matter of course that the moving mechanism is not restricted to this.

Furthermore, in the foregoing description, the example in which through holes serving as passive apertures of the electron beam are formed through one metal plate has been described. However, this is not restrictive. For example, in an alternative mechanism, through holes are formed respectively through different metal plates, and when a passage aperture of one metal plate is positioned in alignment with the optical axis of the electron beam, other metal plates are saved.

Heretofore, suppression of the sample charging conducted by reducing the stored charge Q has been described. However, the movable opposed plate can be utilized not only to suppress the sample charging but also to generate the charging state actively. There is a method called pre-charging (or pre-dosing) among observation methods using a scanning electron microscope. This is a technique of, for example, charging the surface of the sample actively by using an electron beam and then conducting scanning with a beam for measurement. This is a technique of, for example, forming a VC (Voltage Contrast) image of conductive portions and nonconductive portions by conducting scanning with a beam in a state in which both the conductive portions and the nonconductive portions of a pattern are included in an FOV (Field Of View), or conducting observation while pulling up electrons emitted from the hole bottom by positively charging a sample region including a contact hole and then conducting scanning with a beam for observation.

For conducting such pre-charging, the through hole is selected to satisfy the relation "|Q|>0" at the time of the pre-charging. If the sample surface is to be positively charged at this time, conditions are set to make electrons emitted from the sample more than electrons incident on the sample. If the sample surface is to be negatively charged, opposite setting is conducted. If scanning is conducted with a beam while kept in the pre-charge state, the charges are stored accumulatively. After predetermined pre-charging conditions are satisfied, therefore, the conditions are changed to bring about a state which is relatively closer to a "Q≈0" state than the pre-charging state and observation is conducted by conducting scanning with a beam.

For example, in the case where the sample surface is positively charged and then measurement (observation) is conducted, first, a through hole which is relatively less in secondary electron emission quantity than that at the time of observation is selected, electrons incident on the sample are reduced, and the sample surface is positively charged. Then, a through hole which is relatively more in secondary electron emission quantity than that at the time of charging forming, and a state in which "Q" becomes close to zero is brought about.

It is also possible to control Q more precisely by exercising control of landing energy of the electron beam (for example, control of retarding voltage) together at this time. If "Q" is controlled by only switching the through hole, however, it becomes possible to switch between pre-charging and observation without changing the optical conditions of the electron beam. As a matter of course, even if control of the landing energy is exercised jointly, the degree of freedom in setting the optical conditions can be increased as compared with the case where "Q" is changed by simply controlling the landing energy.

REFERENCE SIGNS LIST

101: Primary electron rays
102: Condenser lens
103: Deflection coil
104: Object lens
105: Sample
106: Reflected electrons
107: Secondary electrons
108: Separation mechanism
109: Detector
110: Signal processing apparatus
111: Image display part
121: Precision stage

The invention claimed is:

1. A sample charging control method for controlling charging caused when a sample is irradiated with an electron beam, characterized in that
the sample charging control method comprises a process for selecting one out of a plurality of electron beam passage apertures to selectively dispose one electron beam passage aperture in opposition to the sample, a portion having a secondary electron generation efficiency which differs every one of the plurality of electron beam passage apertures is provided in a peripheral portion of each of the plurality of electron beam passage apertures on a side opposed to the sample, and in the selecting process the one electron beam passage aperture is selected to cause a difference between a quantity of electrons incident on the sample based on irradiation with the electron beam and a quantity of electrons emitted from the sample to become less as compared with other electron beam passage apertures.

2. A sample charging control method in which charging is caused by irradiating a sample with an electron beam and measurement or inspection of the sample is conducted on the basis of electrons detected when irradiating the sample in the charging state with the electron beam, characterized in that
the sample charging control method comprises a charging process for selecting one out of a plurality of electron beam passage apertures to selectively dispose one electron beam passage aperture in opposition to the sample and charging the sample, and a process for selecting one of the electron beam passage apertures different from that in the charging process and conducting measurement or inspection on the sample,
a portion having a secondary electron generation efficiency which differs every one of the plurality of electron beam passage apertures is provided in a peripheral portion of each of the plurality of electron beam passage apertures on a side opposed to the sample, and in the measurement or inspection process the one electron beam passage aperture is selected to cause a difference between a quantity of electrons incident on the sample based on irradiation with the electron beam and a quantity of electrons emitted from the sample to become relatively less as compared with the charging process.

3. A scanning electron microscope including an object lens for focusing an electron beam with which a sample is to be irradiated and a moving stage for moving the sample, characterized in that the scanning electron microscope comprises a moving mechanism between the object lens and the moving stage to selectively position one of a plurality of electron beam passage apertures, and a portion having a secondary electron generation efficiency which differs every one of the plurality of electron beam passage apertures is provided in a peripheral portion of each of the plurality of electron beam passage apertures.

4. The scanning electron microscope according to claim 3, characterized in that the plurality of electron beam passage apertures are formed through one plate-like substance.

5. The scanning electron microscope according to claim 3, characterized in that materials respectively having different secondary electron generation efficiencies are disposed in the peripheral portions of the plurality of electron beam passage apertures.

6. The scanning electron microscope according to claim 3, characterized in that materials respectively having different areas and having same secondary electron generation efficiency are disposed in the peripheral portions of the plurality of electron beam passage apertures.

7. The scanning electron microscope according to claim 3, characterized in that
the scanning electron microscope comprises a control apparatus to control the moving mechanism, and
the control apparatus selects one out of the electron beam passage apertures on the basis of selection of the material of the sample and optical conditions of the electron beam.

* * * * *